United States Patent
Chaji et al.

(10) Patent No.: US 8,947,571 B2
(45) Date of Patent: Feb. 3, 2015

(54) GAIN ADJUSTABLE SENSOR PIXELS, ARRAYS AND ARRAY SYSTEMS AND METHODS THEREFOR

(76) Inventors: G. Reza Chaji, Waterloo (CA); Arokia Nathan, Cambridge (GB)

( * ) Notice: Subject to any disclaimer, the term of this patent is extended or adjusted under 35 U.S.C. 154(b) by 869 days.

(21) Appl. No.: 12/936,930

(22) PCT Filed: Apr. 9, 2009

(86) PCT No.: PCT/CA2009/000484
§ 371 (c)(1),
(2), (4) Date: Dec. 3, 2010

(87) PCT Pub. No.: WO2009/124398
PCT Pub. Date: Oct. 15, 2009

(65) Prior Publication Data
US 2011/0187906 A1  Aug. 4, 2011

(30) Foreign Application Priority Data
Apr. 10, 2008  (CA) ...................................... 2628792

(51) Int. Cl.
*H04N 5/363* (2011.01)
*H04N 3/14* (2006.01)
*H04N 5/355* (2011.01)
*H01L 27/146* (2006.01)

(52) U.S. Cl.
CPC ............. *H04N 3/1512* (2013.01); *H04N 3/155* (2013.01); *H04N 5/35518* (2013.01); *H01L 27/14609* (2013.01)
USPC ........................................................ 348/308

(58) Field of Classification Search
CPC ....................................................... H04N 5/363
USPC ........................................................... 348/300
See application file for complete search history.

(56) References Cited

U.S. PATENT DOCUMENTS

| | | | |
|---|---|---|---|
| 6,246,436 B1 | 6/2001 | Lin et al. | |
| 6,473,122 B1 * | 10/2002 | Kanekal | 348/340 |
| 7,075,049 B2 * | 7/2006 | Rhodes et al. | 250/208.1 |
| 7,327,393 B2 * | 2/2008 | Ying et al. | 348/308 |

(Continued)

FOREIGN PATENT DOCUMENTS

| | | |
|---|---|---|
| EP | 1026747 A2 | 8/2000 |
| FR | 2813000 A1 | 2/2002 |
| GB | 2330905 A | 5/1999 |

OTHER PUBLICATIONS

"Chinese Application No. 200980118463.5, Notice on the First Office Action dated Oct. 16, 2012", 20 pgs. [English translation included].

(Continued)

*Primary Examiner* — Gary C Vieaux
(74) *Attorney, Agent, or Firm* — Schwegman Lundberg & Woessner, P.A.

(57) ABSTRACT

A sensor pixel including a sensor, charge storage, a reset block having a reset input, readout block, and a charge leakage gain adjustment block having a gain adjustment control input. The sensor, charge storage, reset block, readout block, and charge leakage gain adjustment block are each operatively connected to a node. Adjusting the gain of a sensor pixel by storing charge from a sensor in a charge storage connected to a node, leaking charge from the charge storage to reduce the charge at a node, and reading out a state of the pixel represented by the charge of a node.

17 Claims, 12 Drawing Sheets

(56) References Cited

U.S. PATENT DOCUMENTS

2004/0223065 A1   11/2004   Takayanagi
2004/0233313 A1*  11/2004   Ando et al. .................. 348/308
2007/0091191 A1    4/2007   Oike
2007/0181922 A1    8/2007   Huo et al.

OTHER PUBLICATIONS

"European Application No. 09729830.1, Extended Search Report dated Jun. 25, 2012", 7 pgs.

"International Application Serial No. PCT/CA2009/000484, International Preliminary Report on Patentability mailed Oct. 21, 2010", 7 pgs.

"International Application Serial No. PCT/CA2009/000484, International Search Report mailed Jul. 21, 2009", 3 pgs.

"International Application Serial No. PCT/CA2009/000484, Written Opinion of the International Searching Authority mailed Jul. 21, 2009", 5 pgs.

\* cited by examiner

GAIN ADJUSTABLE SENSOR PIXELS, ARRAYS AND ARRAY SYSTEMS AND METHODS THEREFOR

CROSS-REFERENCE TO RELATED APPLICATIONS

This application is a national stage application under 35 U.S.C. §371 of PCT/CA2009/000484, filed Apr. 9, 2009, and published as WO 2009/124398 A1 on Oct. 15, 2009, which claims the benefit of priority to Canadian Patent Application No. 2,628,792 filed Apr. 10, 2008 under the title HIGH DYNAMIC RANGE ACTIVE PIXEL SENSOR. The content of the above patent applications and publication are hereby expressly incorporated by reference into the detailed description and made a part hereof in their entirety.

FIELD

The present description relates to imaging systems, sensor pixels, and sensor pixels, and methods of operation of such systems, pixels and arrays.

BACKGROUND

Sensor pixel circuits (sensor pixels) have many applications. For example, when used in pixel arrays as part of a pixel array system for reading out sensed data, such pixel array systems can be used as charge coupled devices (CCDs) for use in digital cameras. Sensor pixels, pixel arrays and pixel array systems also find use in biomolecular and biomedical imaging, chemical sensing and a wide range of other fields.

It is desirable to provide alternative circuits, arrays and systems. It is also desirable to provide alternative methods of operating existing circuits, arrays and systems, and it is desirable to provide methods of operating alternative circuits, arrays and systems.

SUMMARY

In an aspect an embodiment provides a sensor pixel 100 including a sensor 3, charge storage 5, a reset block 7 having a reset input 11, readout block 9, and a charge leakage gain adjustment block 17 having a gain adjustment control input 19. The sensor 3, charge storage 5, reset block 7, readout block 9, and charge leakage gain adjustment block 17 are each operatively connected to a node A.

The gain adjustment block and the charge storage can be separate components. The gain adjustment block and the charge storage can be the same component.

The block 17 can include an active component operatively connected to leak charge from node A and the readout 9 can include an active component operatively connected to node A as an amplifier, wherein the active components have operating parameters that vary similarly over time.

The active components can be transistors. The components of the pixel 100 can be an integrated circuit containing active components. The sensor 3 can be integrated to the backplane.

The sensor pixel 100 can have all components of the sensor pixel 100 as an integrated circuit.

In another aspect an embodiment provides a method of adjusting the gain of a sensor pixel 100. The method includes storing charge from a sensor 3 in a charge storage 5 connected to a node A, leaking charge from the charge storage 5 to reduce the charge at node A, and reading out a state of the pixel represented by the charge of node A.

The method can further include resetting the charge at node A following reading out of the state, resetting the charge at node A. Leaking charge from the charge storage 5 can further include leaking charge through a charge leakage gain-adjustment block 17 in accordance with a signal at a gain adjustment control input 19 of the block 17.

The method can be performed repeatedly and, over time, the amount of charge leaked after storing charge can be reduced in accordance with a change in operating parameters due to instability of an active component actively connected to node A as an amplifier, and reading out of the state of the pixel can include reading out of the state of the pixel through the amplifier.

Leaking charge can further include leaking charge through an active component whose operating parameters vary similarly over time to the operating parameters of the amplifier active component. The method can further include subjecting the active components to the same bias stress over time.

Leaking charge can include leaking charge in an amount to adjust a dynamic range of the charge at node A in accordance with the dynamic range of an incoming signal to the sensor 3. Leaking charge can include leaking charge to adjust the dynamic range of the charge at node A to avoid saturation during reading out. Leaking charge can include leaking charge to adjust the dynamic range of the charge at node A to avoid saturation during reading out, the amount of the adjustment based on prior reading out.

Leaking charge, reading out, and resetting can include leaking charge, reading out, and resetting through separate paths.

In another aspect an embodiment provides a sensor pixel array 302 including a plurality of sensor pixels 100 in accordance with any one of the above sensor pixels 100, the sensor pixels connected as an array.

In another further aspect an embodiment provides a sensor pixel array system 300 including a sensor pixel array 302 in accordance with the above sensor pixel array 302, an address driver module 304, and a readout module 306. The sensor pixel array 302 is operatively connected to the address driver module 304 and to the readout module 306.

The sensor pixel array system 300 can further include a controller 308 operatively connected to the address driver module 304 and to the readout module 306.

Other aspects and detailed additional features of the above aspects will be evident based upon the detailed description, FIGS. and claims herein.

BRIEF DESCRIPTION OF THE DRAWINGS

For a better understanding of the present embodiments and to show more clearly how embodiments and aspects may be carried into effect, reference will now be made, by way of example, to the accompanying drawings in which.

DETAILED DESCRIPTION

Embodiments are described using a pixel circuit having at least one transistor. The transistor in the pixel circuit may be fabricated in any technologies, including poly silicon, nano/micro Silicon, amorphous silicon, CMOS, organic semiconductor, and metal oxide technologies. A pixel array having the pixel circuit may be an active matrix image sensor array, and may, for example, be used in medical applications from imaging at tissue and organ levels to molecular and cellular levels. Example applications include large area multi-modal biomedical and other x-ray imaging (when coupled to a scintillation layer) to optical bio-molecular imaging, including that of fluorescence-based bio-arrays. Example applications also include sensitive applications including single event detector (single photon, single DNA). The above are examples only and the possible applications are not limited thereby.

In the description below, "pixel" and "pixel circuit" are used interchangeably. In the description below, "signal" and "line" may be used interchangeably as appropriate in the context. In the description below, the terms "line" and "node" may be used interchangeably as appropriate in the context. In the description below, the terms "select line" and "address line" may be used interchangeably. In the description below, "connect (or connected)" and "couple (or coupled)" may be used interchangeably, and may be used to indicate that two or more elements are directly or indirectly in physical or electrical contact with each other.

Included in this description are a variety of pixel circuits that may be used to exploit gain setting, aging reduction, and aging compensation features and other features described herein; however, it is to be recognized that these circuits do not have to utilize these features and can be operated beneficially in alternative manners. Methods of biasing pixel circuits will be described herein to provide features such as gain setting and instability compensation. It is to be recognized that such methods may be applied to the novel pixel circuits described herein; while, the methods may also be applied to alternate pixel circuits including existing pixel circuits.

Pixel circuits described herein will be described with reference to photoelectric sensor pixel circuits; however, it is to be recognized that other sensors and transistors for such sensors, such as chemical sensors, temperature sensors, biomedical transducers, optical sensors, and direct x-ray sensors producing electric charge to be readout of the pixel circuits described herein and other pixel circuits to which the features herein can be applied. Such other sensors may for example be mechanical or chemical sensors, as appropriate. As is known in the art, such sensors may themselves be capacitors.

Like reference numerals will be used in multiple FIGS. and multiple embodiments to designate like components. The description for such like components is understood to apply from embodiment to embodiment for such components unless the context requires otherwise or except as expressly stated. Similarly, like components may be given different reference numerals for ease of reference; however, the description for such like components is understood to apply from embodiment to embodiment for such like components unless the context requires otherwise or except as expressly stated.

Figure 1:
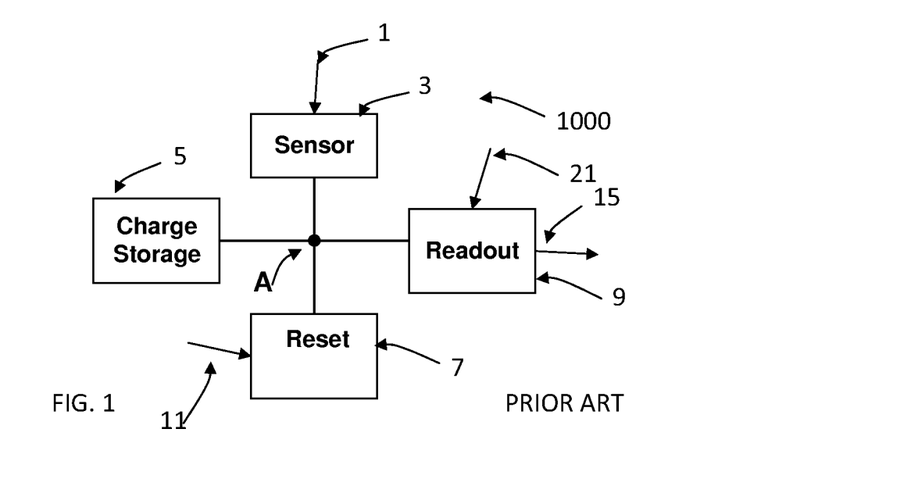
FIG. 1 is a block diagram illustrating a sensor pixel circuit in accordance with prior art architecture.

Referring to FIG. 1, existing sensor pixels 1000 typically have a sensor 3, charge storage 5, reset block 7, and readout block 9, each connected to a charge node A. The sensor 3 converts an environmental or biological signal 1, such as for example light or capacitance, and converts the sensed signal 1 to electric charges. The output of the sensor 3 is an electrical property, such as voltage or current. The storage section 1 stores a representation of the output of the sensor 3 as a voltage. The charge storage 5 stores electrical charge from the sensor 3, such that the charge storage 5 appears at node A. The amount of charge at node A represents the state of the pixel 1000. Reset block 7 has a reset control input 11 and resets the state of the pixel 1000 in accordance with a signal received at the reset control input 11. The reset block 7 resets the state of the pixel 1000 by altering the charge of the charge storage 5 and, thus, the charge at node A. Readout block 9 has a sensor pixel output 15 and provides access to the state of the pixel 1000 at the sensor pixel output 15 so that the state of the pixel 1000 can be read at the sensor pixel output 15 by an external module, not shown (but see example in FIG. 3 for pixel 100).

Figure 2:
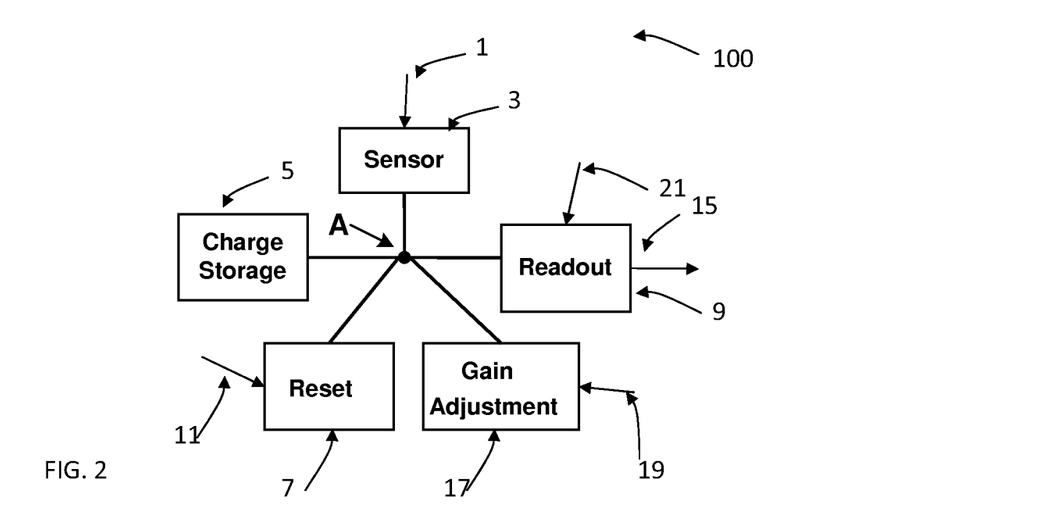
FIG. 2 is a block diagram illustrating a sensor pixel circuit in accordance with an embodiment incorporating a gain adjustment block.

Referring to FIG. 2, a charge leakage gain-adjustable sensor pixel 100 also has a sensor 3, charge storage 5, reset block 7, and readout block 9, each connected to node A. The gain-adjustable sensor pixel 100 also has a gain adjustment block 17 connected to node A. The gain adjustment block 17 has a charge leakage gain adjustment control input 19. The gain adjustment block 17 leaks the charge from the charge storage 5 in accordance with a signal at the control input 19 and, thus, the charge at node A. This adjusts the effective charge-to-voltage conversion of the sensor pixel 100. As a result the voltage seen by the readout block 9 is adjusted, and the sensor pixel output 15 is adjusted. Thus, the overall gain of the pixel 100 from sensor 3 receipt of signal 1 to pixel output 15 is also adjusted.

The dynamic range of the sensor pixel 100 can be adjusted. Also, the sensor pixel 100 instability can be compensated. The dynamic range can be adjusted by adjusting the on-pixel gain. Sensor pixel driving schemes can provide low noise, high sensitivity, and high dynamic range. Gain adjustment block 17 can adjust the dynamic range of the charge stored from the sensor 3 by the charge storage 5 and, thus, the charge at node A. This can prevent saturation of active in-pixel readout block 9 or an external module. Instability can be compensated by gain-adjusting the sensor pixel 100 in an amount corresponding to instability changes in the pixel gain.

Sensor pixel 100 with components formed on integrated circuits can have a backplane containing active components such as transistors and diodes. A sensor 3 within the sensor pixel 100 can be integrated to the backplane or may be provided as a discrete component. Passive components, such as capacitors can be integrated to the backplane or provided as a discrete component. Thus, an entire sensor pixel 100 can be an integrated circuit, discrete components, or a combination of an integrated circuit and discrete components. Where instability compensation is part of the pixel 100 then the active components will be formed in an integrated circuit such that component manufacturing parameters will be matched.

Figure 3:
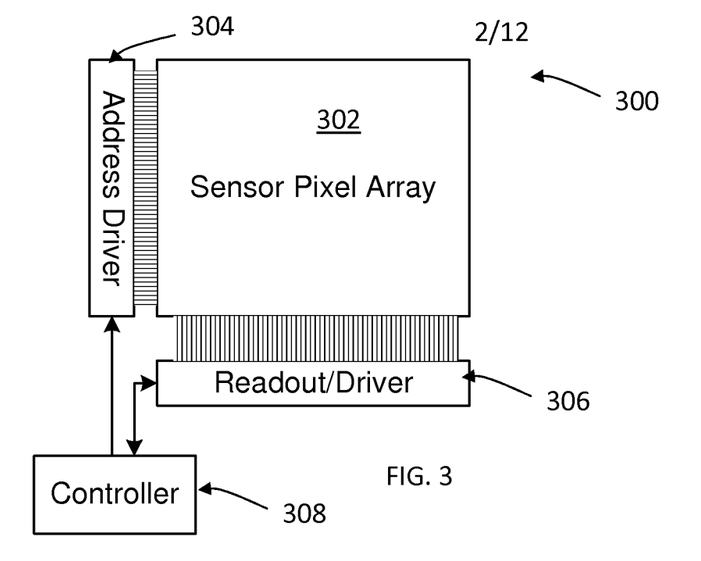
FIG. 3 is a diagram illustrating an example of an array system incorporating sensor pixels in accordance with FIG. 2.

Referring to FIG. 3, a sensor pixel array system 300 has a sensor pixel array 302 connected to an address driver module 304 and a readout module 306. The modules 304, 306 are each connected to a controller 308. The array 302 has a plurality of sensor pixels 100 connected as an array. The address driver module 304 provides the controlling signals to the pixels 100 and the array 302. The readout module 306 reads the output 15 of each pixel 100 and transmits the readout pixel output to the controller 308. The controller 308 controls the timing of modules 304, 306, and, thus, the blocks 7, 9, 17.

The controller 308 can adjust the gain of a pixel 100 by adjusting the timing of the block 9. The adjustments can be made according to feedback the controller 308 receives from the readout module 306. This can provide on-the-fly gain adjustment of individual sensor pixels 100 based on data collected from the sensor pixel 100. Alternatively, where the sensor array system is used in different applications, the gain can be adjusted based on anticipated signal intensity of the application.

Figure 26:
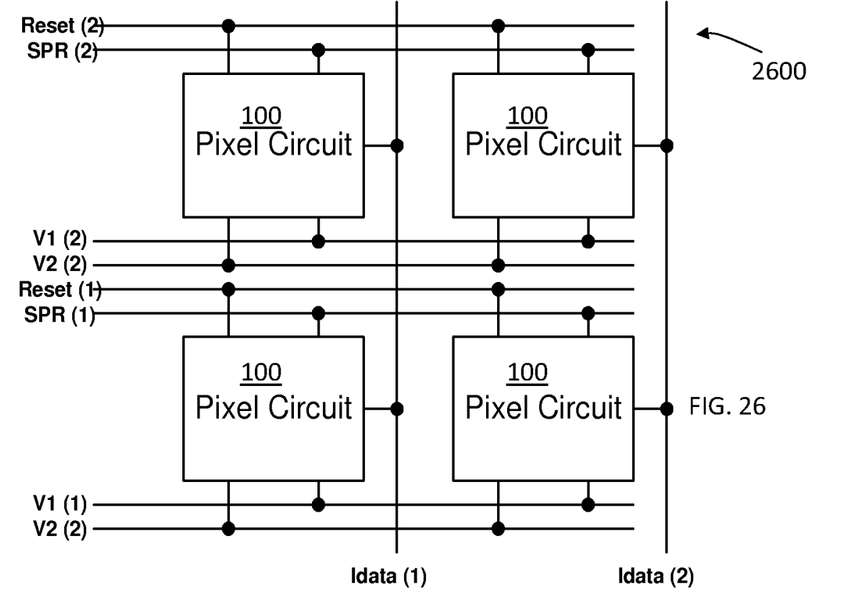
FIG. 26 is a schematic diagram of an example embodiment of a pixel array including example pixels according to the embodiment of FIG. 2.

Referring to FIG. 26, an example pixel array 2600 that may be used as the pixel array 302 is shown. It is recognized that the control inputs Reset, SPR, V1, and V2 will not be used in all embodiments of the array 302 as will be evident from the pixel embodiments described; later herein. Idata provides the pixel output 15. For example, V1($i$) ($i$=1, 2, ... ) represents a bias line for the ith row and V2($i$) represents another bias line for the ith row; and Idata (j) (j=1, 2, ... ) represents a data line for the jth column. Reset, SPR, V1 and V2 are driven by the address driver 304. Idata(j) is read by the readout module 306. A row is selected by applying a pulse to its corresponding V1 and V2 lines (e.g. V1[1] and V2[1]). The output current of each pixel 100 in a selected row is typically read out by a trans-resistance or charge amplifier of the readout module 304.

Example embodiments of various sensor pixels 100 and example embodiments of timing driving schemes will now be described. The gain adjustment block 17 will provide charge-based compensation in a pixel circuit 100 that is suitable for a real-time imager. The gain adjustment block 17 of the illustrated detailed embodiments provide a discharging path that can be used to compensate for aging and gain mismatches, and to adjust the gain of a pixel 100 for different applications.

Figure 4:
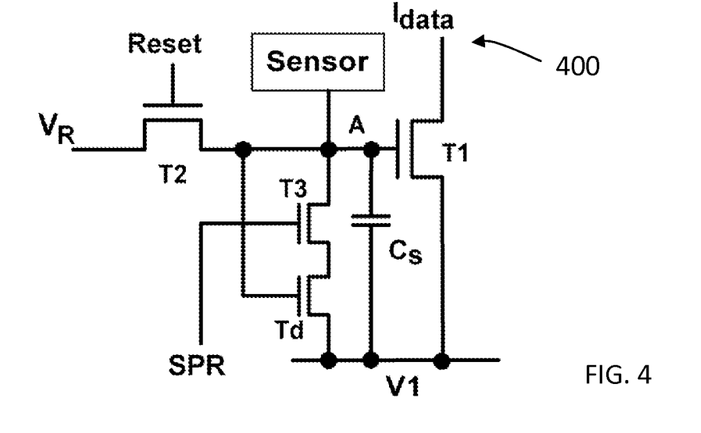
FIG. 4 is an example circuit diagram of an embodiment of a pixel sensor circuit in accordance with the block diagram of FIG. 2.

Referring to FIG. 4, a pixel circuit 400 has a sensor 3, a capacitor $C_S$ that forms the charge storage 5, a switching transistor $T_2$ that forms the reset block 7, and an amplifier transistor $T_1$ that forms the readout block 9, and diode connected transistor $T_D$ and switching transistor $T_3$ that form the gain adjustment block 17. Reset control input 11 is provided to $T_2$ and SPR input to switching transistor $T_3$ provides gain control input 19. V1 provides a bias input for the storage 5, readout block 9, and gain adjustment block 17.

Figure 5:
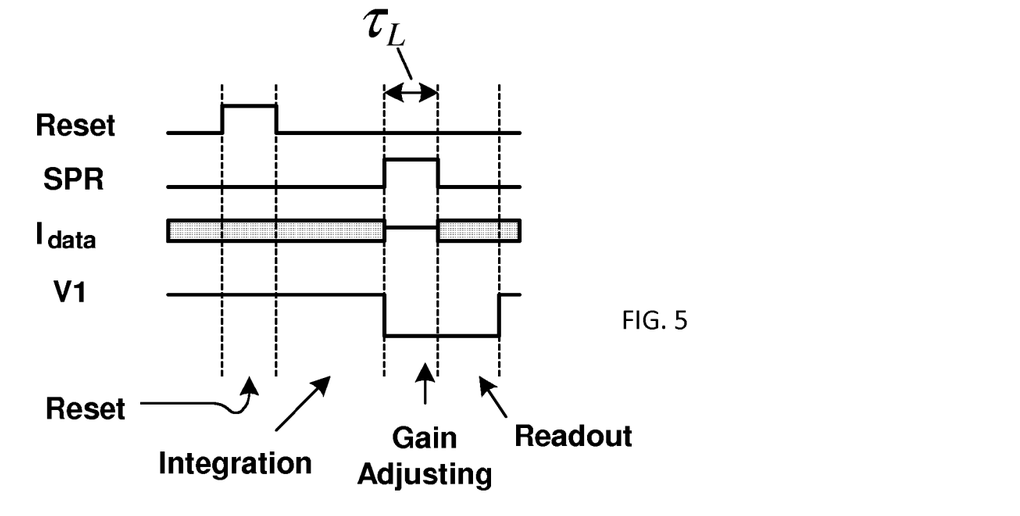
FIG. 5 is an example embodiment of a timing chart for the sensor pixel of FIG. 4.

Referring to FIG. 5, in an example timing for driving the circuit 400, during a reset cycle (the Rest control input 11 is brought high to turn on transistor $T_1$), node A is charged to a reset voltage ($V_R$). The next cycle can be discharging for compensation as will be described for later embodiments. For this embodiment, discharging for compensation is not illustrated. Accordingly, the next cycle is an integration cycle. During integration, the sensor 3 output is collected by the storage capacitor $C_S$. During the gain-adjusting cycle SPR turns on $T_3$ and some stored voltage from node A leaks out through $T_d$. Leakage time ($\tau_L$), the duration for which $T_3$ is switched on and the gain adjustment block 17 is activated, can be adjusted for different applications to control the gain of the pixel 100. V1 goes low during the gain adjusting cycle to ensure Td is forward biased.

After integration and gain-adjustment through charge leakage, there is a readout cycle. During the readout cycle, the amplifier transistor $T_1$ is switched on by biasing it low at V1. Thus, V1 provides a readout control input 21 to readout block 9. Readout control input 21 is utilized for an active sensor pixel that incorporates an amplifying transistor $T_1$. Timing for the readout control input 21 is provided by the controller 308 in a similar manner to the other control input, reset input 11. Non-readout switched passive sensor pixel circuits can dispense with a switched transistor T1 and the readout control input 21 where the switching function is performed off circuit, for example by the readout module 306.

Idata, the current through the transistor $T_1$ provides sensor pixel output 15 that is read by the readout module 306 for the controller 308. The read operation is not destructive, as the pixel circuit 400 operates in active mode.

The remaining voltage ($V_{dmp}$) at node A after the gain adjusting cycle is given by $$V_{dmp} = V_R - V_{gen} - \frac{(V_R - V_{gen} - V_T)^2}{(V_R - V_{gen} - V_T) + \tau/\tau_L}. \quad (1)$$

Here, $V_{gen}$ is the generate voltage due to the collected charge. By assuming that $V_{gen}$ is much smaller than $V_R$, a linear approximation can be employed to calculate the damping effect ($A_{dmp}$) as the following:

$$A_{dmp} = \frac{1}{1 + \frac{\tau_L(V_R - V_T)}{\tau}}. \qquad (2)$$

Figure 6:
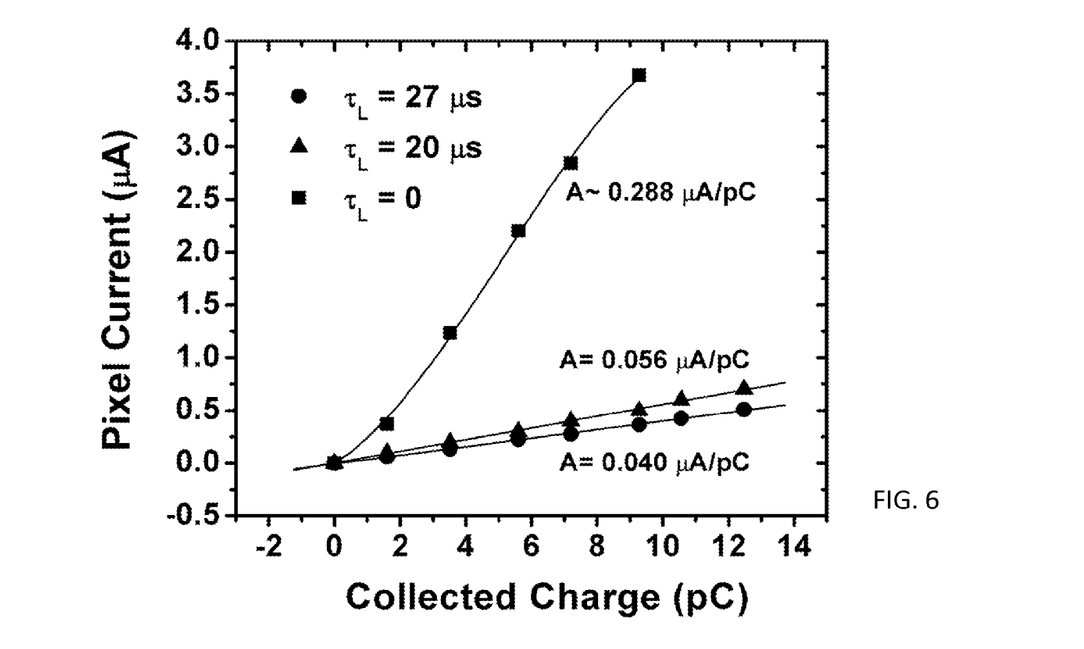
FIG. 6 is a graph of example pixel readout current versus collected charge for the circuit of FIG. 5 employing the timing of FIG. 6.

An example measurement result for different leakage times is shown in FIG. 6. The gain of the pixel can be adjusted for various applications. For example for very low intensity input signals (e.g. fluoroscopy) the leakage time can be close to zero which allows a high gain. On the other hand the leakage time can be increased (e.g. 27 µs) for higher intensity input signals (e.g. radiology). The pixel response to the collected charge can be smoothed, such that the pixel gain can be more linear, or even linear.

Figure 7:
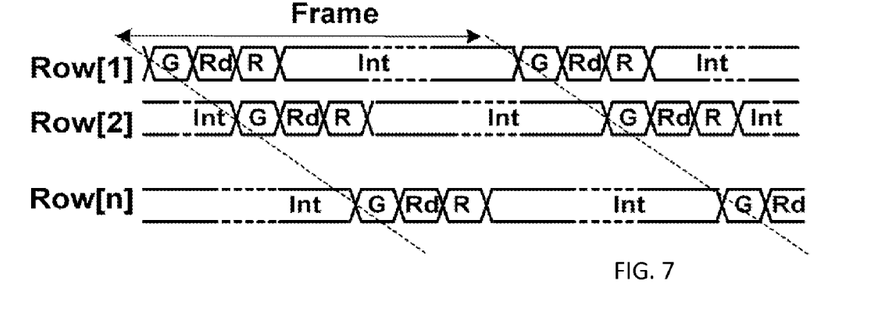
FIG. 7 is an example timing schedule for real-time imaging application of the array system of FIG. 2 where the sensor pixels are in accordance with FIG. 4.

The pixel circuit 400 can provide for parallel operation of reset and readout cycles for different rows of pixels 400 in an array 302. As a result, it can be used for real-time imaging applications such as fluoroscopy. FIG. 7 shows an example timing schedule for an array 302 intended for real-time imaging where R is reset cycle, Int is integration cycle, G is gain adjustment cycle, and Rd is readout cycle.

Figure 8:
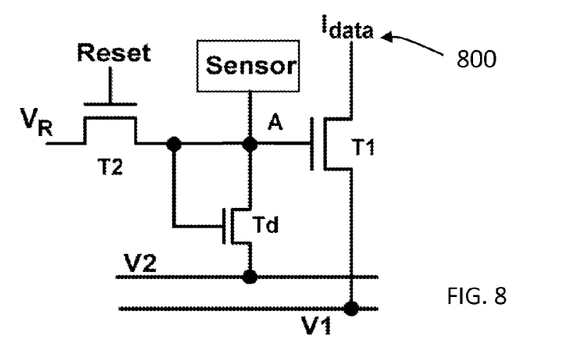
FIG. 8 is a further example circuit diagram of an embodiment of a pixel sensor circuit in accordance with the block diagram of FIG. 2.

Referring to FIG. 8, in sensor pixel 800 T3 and Td can be merged and also Td can replace the storage capacitor $C_S$. This results in a 3-TFT gain-adjustable sensor pixel 800. This can provide improved resolution by reducing in-pixel components and increasing pixel density. V1 biases only the amplifying transistor T1 to switch T1 on and off. Td now acts as both the charge storage 5 and the gain adjustment block 17. V2 biases Td.

Figure 9:
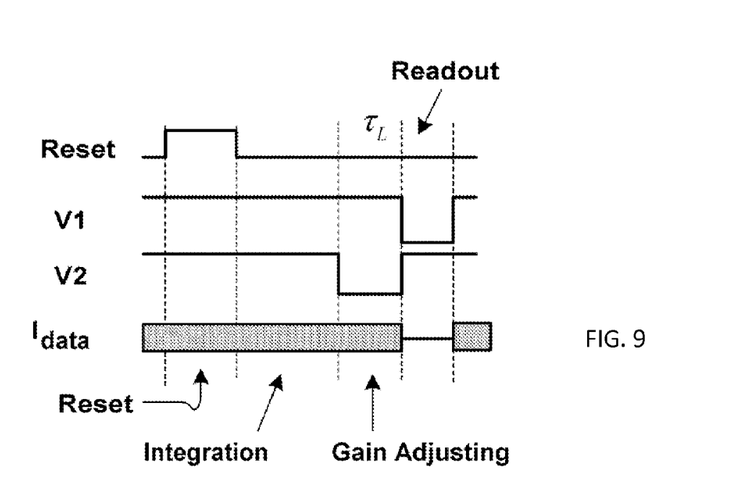
FIG. 9 is an example embodiment of a timing chart for the sensor pixel of FIG. 8.

Referring to FIG. 9, V2 switches Td off and on to provide the gain adjustment control input 19, while the other timing remains the same.

Figure 10:
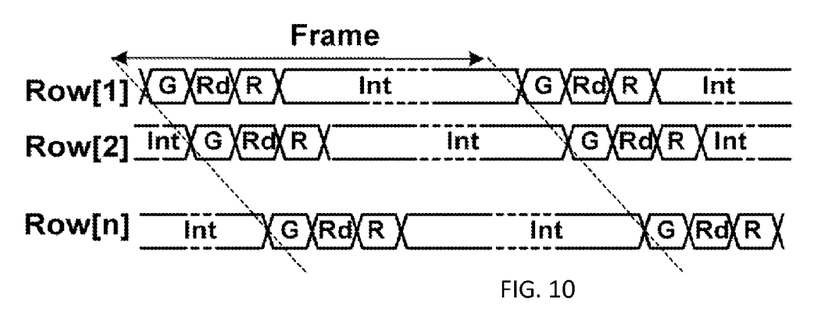
FIG. 10 is an example timing schedule for real-time imaging application of the array system of FIG. 2 where the sensor pixels are in accordance with FIG. 8.

Referring to FIG. 10, the pixel 800 provides a separate path for gain adjusting, reset and readout (the biasing of Td and T1 being performed separately by V1 and V2); thus, the timing schedule can be improved for more parallelism as shown. While the pixels 800 in one row are being reset, the next adjacent row's pixels are in the gain cycle, and the row after that is readout. As a result, the pixel 800 can provide for a fast refresh rate suitable for high frame rate real-time imaging.

Figure 11:
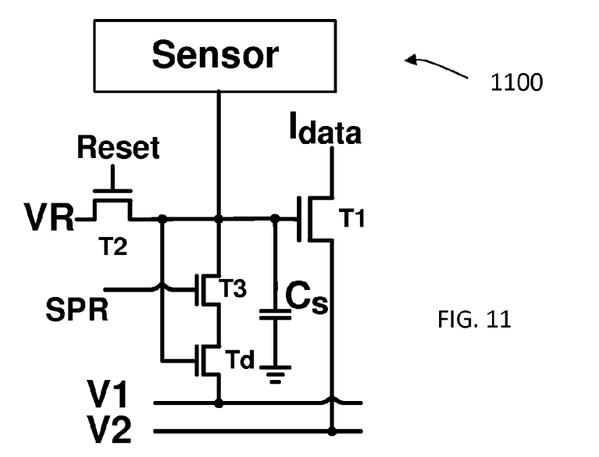
FIG. 11 is another example circuit diagram of an embodiment of a pixel sensor circuit in accordance with the block diagram of FIG. 2.

Referring to FIG. 11, a sensor pixel 1100 is similar to the pixel 100, but has separate bias lines V1 and V2 to allow for separate gain adjusting, reset and readout paths. The other control inputs are similar to those in pixel 100. Pixel 1100 has four control inputs: V1, V2, Reset and SPR.

Figure 13:
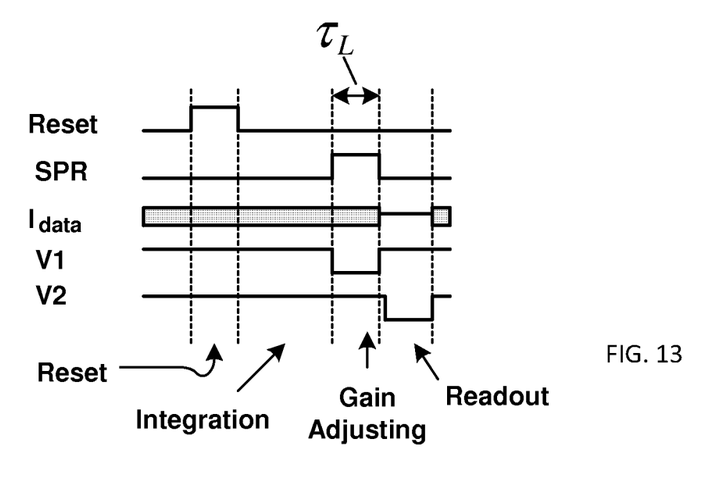
FIG. 13 is an example embodiment of a timing chart for the sensor pixel of FIG. 11.

Referring to FIG. 13, an example driving timing for the pixel 1100 is shown. V1 ensures that forward biasing of the gain adjustment block 17 at the same time as it is switched on at the gate of T3.

Figure 12:
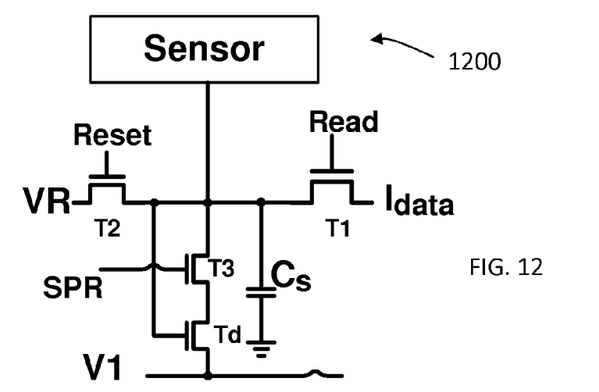
FIG. 12 is another further example circuit diagram of an embodiment of a pixel sensor circuit in accordance with the block diagram of FIG. 2

Referring to FIG. 12, a switched passive pixel 1200 is again similar to the pixel 100; however, T1 is configured as a passive switch transistor, and Read provides the readout control input 21. The other control inputs are similar to those in pixel 100.

Figure 14:
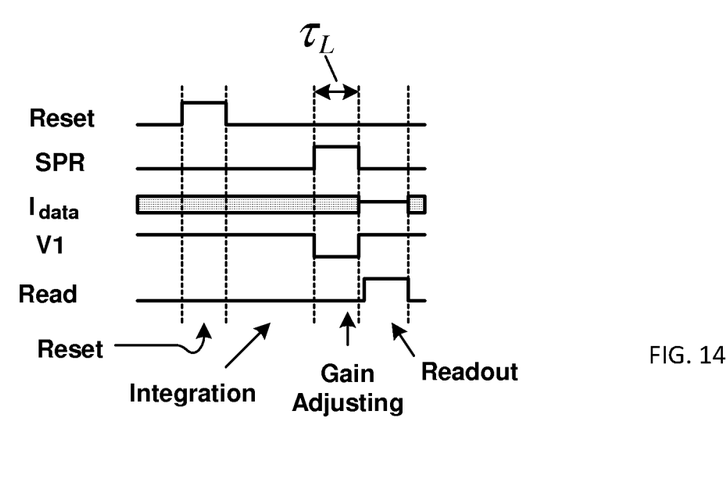
FIG. 14 is an example embodiment of a timing chart for the sensor pixel of FIG. 12.

Referring to FIG. 14, an example driving timing for the pixel 1200 is shown. V1 ensures that forward biasing of the gain adjustment block 17 at the same time as it is switched on at the gate of T3. Read ensures that the output transistor T1 is off except during the read cycle.

It is noted that for the pixels 1100 and 1200 Td can replace storage capacitor Cs as described in pixel 800. Td can also be a diode. Also, the position of Td and T3 can be interchanged without affecting the pixel operation.

Referring to FIGS. 13 and 14, during the reset cycle, T2 is ON and so node A is charged to the reset voltage (VR). During the integration cycle, the charge generated by the sensor is accumulated in CS. During the gain adjusting cycle, T3 is ON and so part of the charge stored in CS is leaked out through Td. As a result, the dynamic range of the output of the sensor can be controlled. During the readout cycle, the voltage of node A is converted to current by T1 and sent to the external Readout/Driver module 306.

Figure 15:
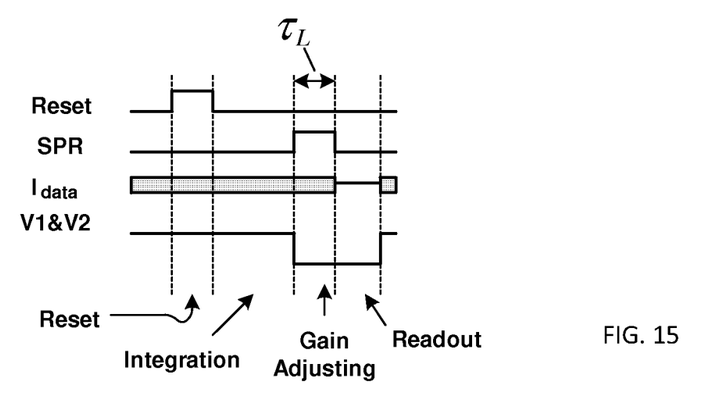
FIG. 15 is a further example embodiment of a timing chart for the sensor pixel of FIG. 11.

Referring to FIG. 15, a further example driving timing for pixel 1100 is shown where V1 and V2 have the same timing signal. The merged signal is low during the gain adjusting cycle and during the readout cycle. This take advantage of the benefit of separate paths within the pixel 1100, while reducing the complexity of the timing control.

Figure 16:
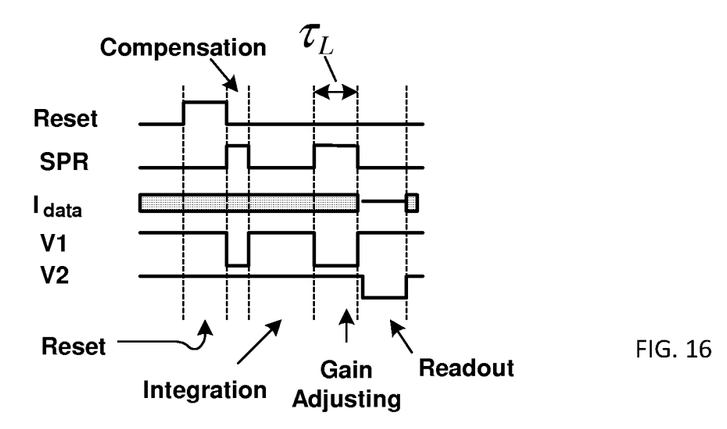
FIG. 16 is another example embodiment of a timing chart for the sensor pixel of FIG. 11.

Referring to FIG. 16, a further example driving timing for pixel 1100 is shown. A new driving cycle has been added to the pixel operation to provide in-pixel leak discharge gain adjustment through transistor Td matching operating characteristics of the amplifying transistor T1 to compensating for temporal instability of T1. The characteristics of T1 change over time which is referred to as temporal instability or threshold voltage shift. The transistor Td will match the operating characteristic of T1 over time as they have the same biasing condition. Thus, if the gain of T1 decreases over time then the gain of Td will decrease as well. Although T1 will provide less amplification for a given bias voltage remaining at node A; Td will discharge less charge from the charging node A, leaving more charge at node A to bias T1 and so the gain of the pixel will remain the same over time.

During the compensation cycle, T3 is ON and so part of the reset voltage (VR) is being discharged through Td. Since the discharge voltage is a function of Td parameters, any change in Td's parameter will affect the remaining voltage at node A in a reverse direction. For example, if the threshold voltage of Td increases due to bias induced instability, the discharged voltage will be smaller in a given time and so the remaining voltage at node A will be larger. Also, since Td and T1 experience similar biasing conditions over time, and therefore similar biasing stress, their parameters follow the same trend. Instability compensation does not require that the biasing condition be the same at all times, rather the similar biasing conditions be experienced over a longer term. For example, if Td is on for 10 us and off for the rest of the frame, T1 is also high with the same level at 10 us. That means the change in reset voltage based on Td parameter, will compensate for T1 parameter change as well. Such instability compensation can be used for other pixels described herein.

Figure 17:
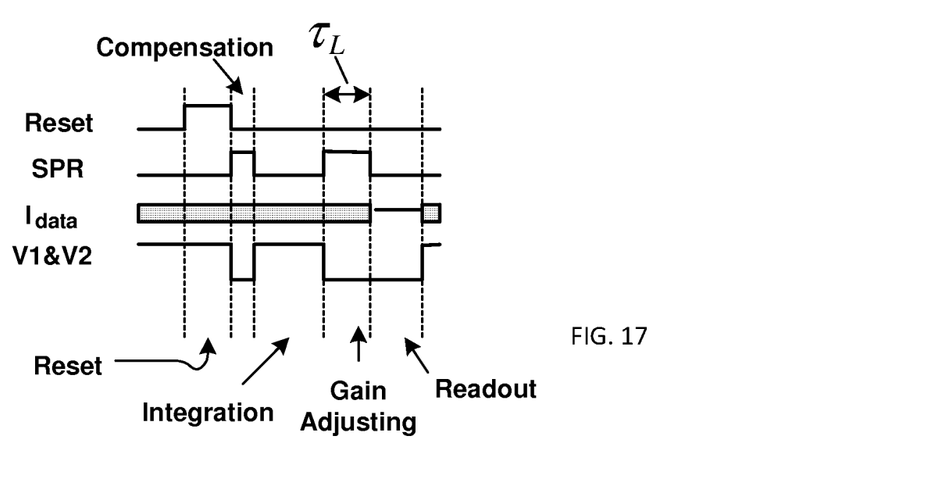
FIG. 17 is another further example embodiment of a timing chart for the sensor pixel of FIG. 11.

Referring to FIG. 17, a further example driving timing for pixel 1100 is shown. The timing cycle is similar to that of FIG. 15 with the addition of a driving cycle for compensating for the instability of T1 similar to that described with respect to FIG. 16.

Figure 18:
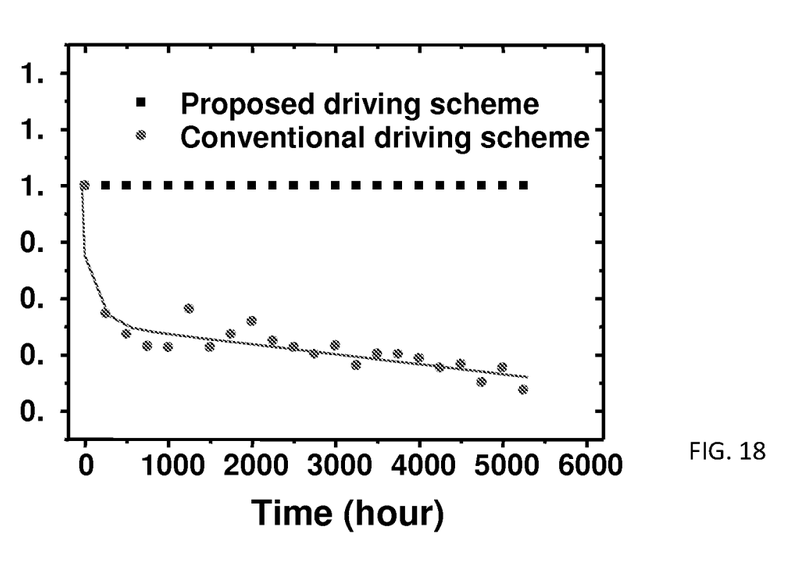
FIG. 18 is a graph of example normalized amplifier gain over time with and without aging compensation for the sensor pixel of FIG. 2.

Referring to FIG. 18, an illustration of example effect of instability compensation for amplifying transistor T1 aging over time when compared to a non-instability compensated drive timing. The vertical axis is the gain of the pixel 1100 from the sensor 3 output to the pixel output 15. The gain of the pixel 1100 under the timing of FIG. 17 (instability compensated) is shown as a constant line of square dots, while the gain of the pixel 1100 under the timing of FIG. 15 (non-instability compensated) is shown as a non-linearly decreasing curve of round dots.

Figure 19:
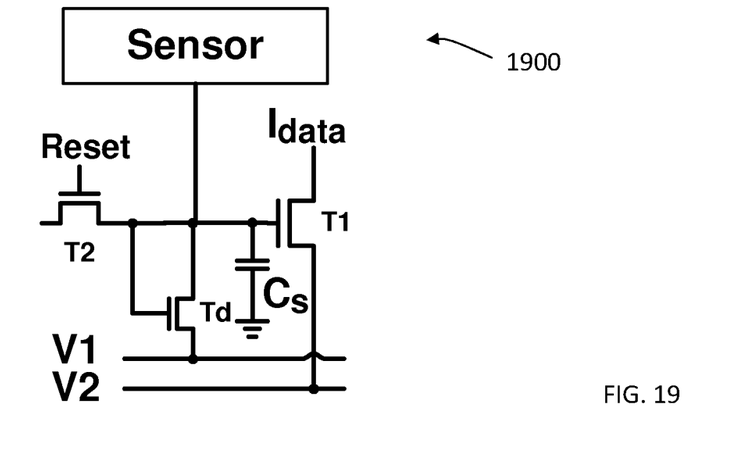
FIG. 19 is further example circuit diagram of an embodiment of a pixel sensor circuit in accordance with the block diagram of FIG. 2.

Referring to FIG. 19, a pixel 1900 is similar to pixel 800 in that T1 is diode connected and replaces T3. V1 biases Td and performs switching function in the same manner that V2 does for pixel 800. Pixel 1900 retains storage capacitor CS in the same manner as, for example, pixel 400, and does not rely on the internal capacitance of Td.

Figure 20:
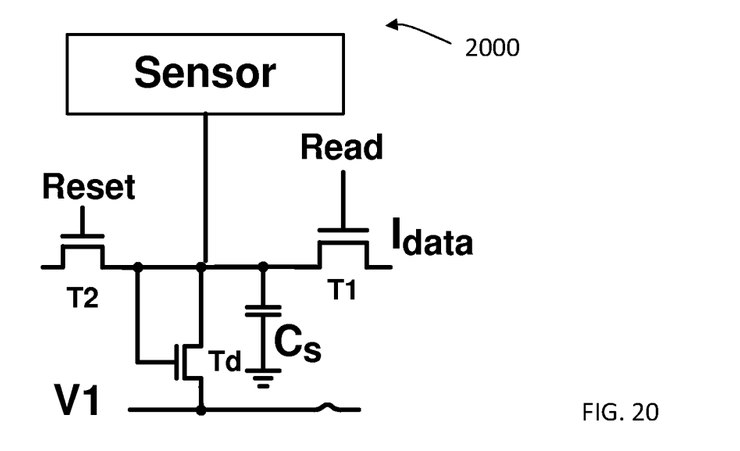
FIG. 20 is another further example circuit diagram of an embodiment of a pixel sensor circuit in accordance with the block diagram of FIG. 2.

Referring to FIG. 20, a pixel 2000 is similar to the pixel 1900 except that transistor T1 is passive switch connected for the readout block 9, similar to T1 of pixel 1200, rather than amplifying connected. This results in a passive pixel 2000. Read input to the gate of T1 performs the switching for readout purposes, rather than V2.

Figure 21:
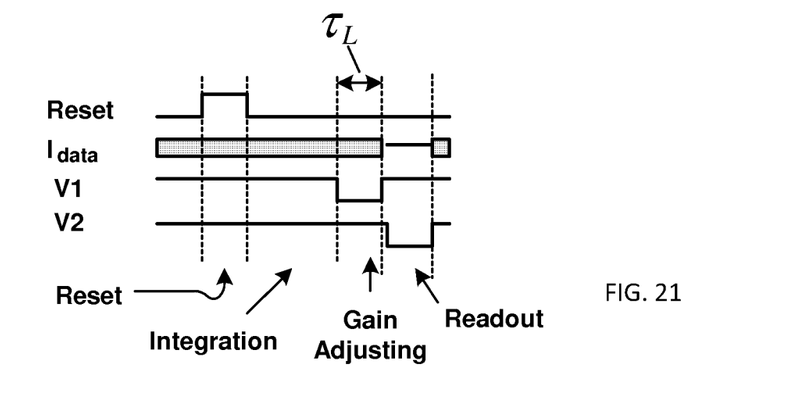
FIG. 21 is an example embodiment of a timing chart for the sensor pixel of FIG. 19.
Figure 22:
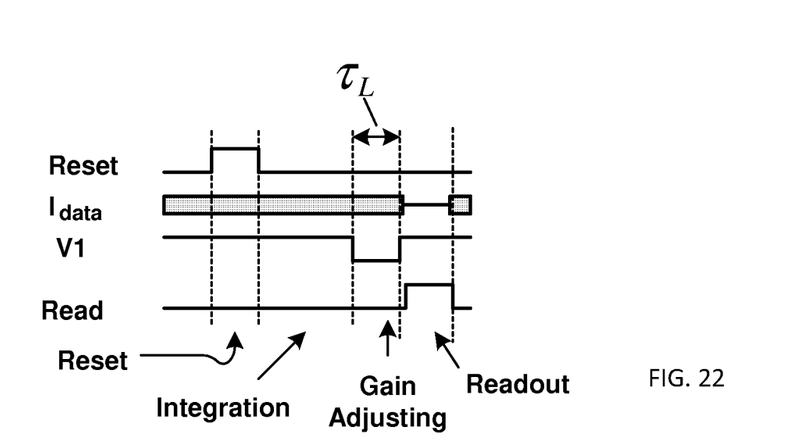
FIG. 22 is an example embodiment of a timing chart for the sensor pixel of FIG. 20.

Referring to FIG. 21, an example driving timing for the pixel 1900 is shown. Referring to FIG. 22, an example driving timing for the pixel 2000 is shown.

Referring to FIGS. 21 and 22, the example timing of the pixels 1900 and 2000 is similar to the timing in FIGS. 13 and 14, respectively; except, during the gain adjustment cycle, V1 is low and so Td is ON. When Td is on, part of the charge stored at node A is discharged through Td adjusting the gain.

Figure 23:
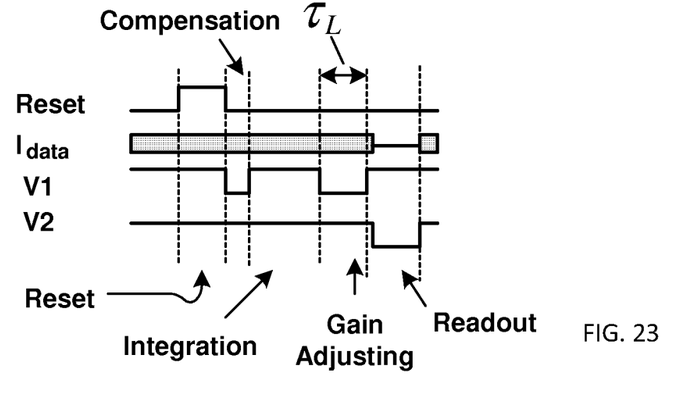
FIG. 23 is a further example embodiment of a timing chart for the sensor pixel of FIG. 19.

Referring to FIG. 23, an example timing embodiment is provided for pixel 2100. The timing embodiment is similar to the timing of FIG. 21, with an additional compensation cycle similar to FIG. 16.

Figure 24:
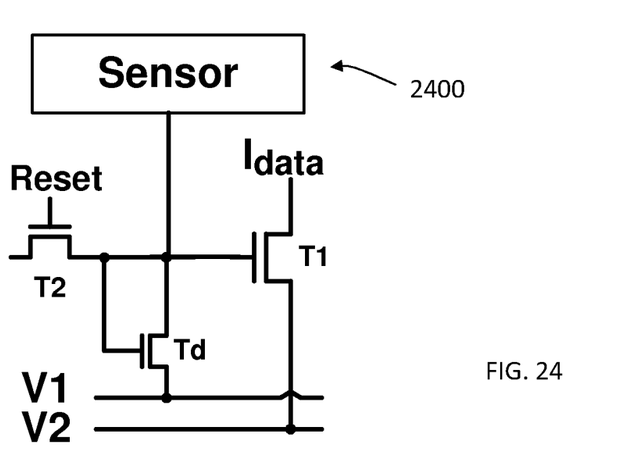
FIG. 24 is another example circuit diagram of an embodiment of a pixel sensor circuit in accordance with the block diagram of FIG. 2.

Referring to FIG. 24, a pixel circuit 2400 is similar to pixel circuit 1900; except, the reset block 7 and the gain adjustment block 17 are merged together in a diode connected transistor Td. Td performs both reset of node A and gain adjustment through leakage from node A.

Figure 25:
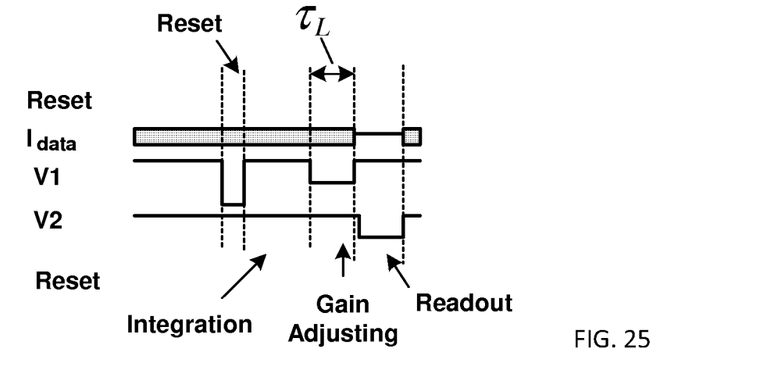
FIG. 25 is an example embodiment of a timing chart for the sensor pixel of FIG. 24.

Referring to FIG. 25, an example driving timing for the pixel of FIG. 24 is shown. During the reset cycle, V1 goes to a very low voltage (−VR), as a result, the voltage at node A will go to "−VR+VT". Then, V1 goes to a bias voltage (VB). This way, not only, is the node A reset to a known voltage, but also, the reset voltage can compensate for the instability of T1 and Td as well. During the integration cycle, the charge created by the sensor is accumulated in the storage capacitor. During the gain adjustment cycle, the voltage at node A is discharged and so tuned the gain. During the readout cycle, the signal is read back through T1.

Gain adjustment for transistor instability can be provided separately from dynamic range gain adjustment.

As pixel components are reduced in different embodiments the density of a corresponding pixel array can be increased. This can allow for increased resolution.

In the pixels described above, it will be well understood that the storage capacitor Cs can be a transistor. Similarly, the sensor 3 may be a capacitor for non-optical sensors, such as for example mechanical or chemical sensor applications.

In some embodiments the sensor pixels described herein can be used in place of pixels in existing charge coupled devices (CCDs) commonly used in a variety of applications, including bio-imaging.

Although terms such as high and low, and ground have been used, this is not a limitation of the embodiments to specific driving polarities or component orientations. For example, it is well understood by one of ordinary skill in the art that the NMOS circuit components can be replaced with PMOS circuit components using the concept of complementary circuit design, with resulting alteration of the driving polarities and components orientations. Consequent circuit alterations may be required to interface to circuit components, or external modules for which the driving polarity or orientation is unchanged.

Although specific embodiments of gain-adjustable pixels have been described herein, it is recognized that gain-adjustment may be combined with other techniques known in the other to improve performance or suitability for particular applications. For example, in the pixels described above, the storage capacitor Cs may be a variable capacitor to vary further the pixel performance at different input intensity. For example, for x-ray imager, a low capacitor can be used low x-ray intensity to improve the charge to voltage conversion. On the other hand, for high x-ray intensity a large capacitance can provide better performance in terms of dynamic range.

One way to achieving a variable capacitor is to use a metal-insulator-semiconductor (MIS) structure instead of metal-insulator-metal (MIM). By changing the bias condition the capacitor Cs, one can adjust the storage capacitance for different application.

It is recognized that gain-adjustable pixels may be combined with such other techniques while remaining within the scope of the description herein.

One or more currently preferred embodiments have been described by way of example. It will be apparent to persons skilled in the art that a number of variations and modifications can be made without departing from the scope of the invention as defined in the claims.

What is claimed is:

1. A sensor pixel comprising:
   a node,
   a sensor,
   charge storage,
   a reset block having a reset input,
   readout block, and
   a charge leakage gain adjustment block for the node, including at least one controllable switching transistor biased by and for discharge to a controllable low voltage and the at least one controllable switching transistor including a transistor having a gain adjustment control input, the gain adjustment control input and the controllable low voltage both controllable at a leakage time to effect charge leakage gain adjustment from the node,
   wherein the sensor, charge storage, a reset block, readout block, and charge leakage gain adjustment block are each operatively connected to the node.

2. The pixel of claim 1 wherein the charge leakage gain adjustment block and the charge storage are separate components.

3. The pixel of claim 1 wherein readout from the readout block comprises an active component operatively connected to the node as an amplifier.

4. The pixel of claim 3 wherein the active component comprises a transistor.

5. The pixel of claim 1 wherein at least one of the sensor, charge, storage, reset block, and readout block is part of an integrated circuit containing active components.

6. The pixel of claim 5 wherein the sensor is integrated to a backplane of the integrated circuit.

7. The sensor pixel of claim 1 wherein the sensor pixel is an integrated circuit.

8. A method of adjusting the gain of a sensor pixel, the method comprising:
   storing charge from a sensor in a charge storage connected to a node,
   leaking charge from the charge storage to reduce the charge at the node through a charge leakage gain adjustment block including at least one controllable switching transistor biased by and for discharge to a controllable low voltage and the at least one controllable switching including a transistor having a gain adjustment control input, in accordance with controlling at a leakage time both the controllable low voltage and a signal at the gain adjustment control input, and
   reading out a state of the pixel represented by the charge of the node.

9. The method of claim 8 further comprising resetting the charge at the node following reading out of the state, resetting the charge at the node.

10. The method of claim 9 wherein leaking charge, reading out, and resetting comprise leaking charge, reading out, and resetting through separate paths.

11. The method of claim 8 wherein the method is performed repeatedly and, over time, the amount of charge leaked after storing charge is reduced in accordance with a change in operating parameters due to instability of an active component actively connected to the node as an amplifier, and reading out of the state of the pixel comprises reading out of the state of the pixel through the amplifier.

12. The method of claim 8 wherein leaking charge comprises leaking charge in an amount to adjust a dynamic range of the charge at the node in accordance with the dynamic range of an incoming signal to the sensor.

13. The method of claim 8 wherein leaking charge comprises leaking charge to adjust a dynamic range of the charge at the node to avoid saturation during reading out.

14. The method of claim 8 wherein leaking charge comprises leaking charge to adjust a dynamic range of the charge at the node to avoid saturation during reading out, the amount of the adjustment based on prior reading out.

15. A sensor pixel array comprising:
a plurality of sensor pixels in accordance with claim 1, the sensor pixels connected as an array.

16. A sensor pixel array system comprising:
a sensor pixel array in accordance with claim 15,
an address driver module, and
a readout module
wherein the sensor pixel array is operatively connected to the address driver module and to the readout module.

17. The sensor pixel array system of claim 16 further comprising a controller operatively connected to the address driver module and to the readout module.

* * * * *